United States Patent [19]
Yamashita

[11] Patent Number: 5,643,802
[45] Date of Patent: Jul. 1, 1997

[54] METHOD OF PRODUCING A SEMICONDUCTOR DEVICE BY GANG BONDING FOLLOWED BY POINT BONDING

[75] Inventor: Chikara Yamashita, Tokyo, Japan

[73] Assignee: NEC Corporation, Japan

[21] Appl. No.: 634,443

[22] Filed: Apr. 18, 1996

[30] Foreign Application Priority Data

Apr. 21, 1995 [JP] Japan .................................. 7-096465

[51] Int. Cl.⁶ .......................... H01L 21/607; H01L 21/68
[52] U.S. Cl. .................... 437/9; 437/209; 437/217
[58] Field of Search ............................. 437/9, 209, 217, 437/183, 220; 228/180.22; 257/671

[56] References Cited

U.S. PATENT DOCUMENTS

| | | |
|---|---|---|
| 3,650,454 | 3/1972 | Coucoulas . |
| 3,697,828 | 10/1972 | Oakes . |
| 4,209,355 | 6/1980 | Burns . |
| 4,295,912 | 10/1981 | Burns . |
| 4,776,509 | 10/1988 | Pitts et al. . |
| 5,569,956 | 10/1996 | Chillara et al. . |

*Primary Examiner*—George Fourson
*Assistant Examiner*—Scott Kirkpatrick
*Attorney, Agent, or Firm*—Hayes, Soloway, Hennessey, Grossman & Hage, P.C.

[57] ABSTRACT

A method of producing a semiconductor device is disclosed and includes steps of temporarily connecting inner leads or lands provided on a film carrier tape and electrode pads provided on an IC chip at the same time by low-temperature gang bonding, and then bonding them by point bonding. The method enhances the reliable production of a semiconductor device by reducing the influence of localized load and temperature ascribable to the short accuracy of the gang bonding jig as well as the influence of the deformation of a film carrier tape due to heat applied during point bonding.

6 Claims, 4 Drawing Sheets

METHOD OF PRODUCING A SEMICONDUCTOR DEVICE BY GANG BONDING FOLLOWED BY POINT BONDING

BACKGROUND OF THE INVENTION

The present invention relates to a method of producing a semiconductor device and, more particularly, to a method of producing a film carrier semiconductor device.

Generally, to produce a film carrier semiconductor device, use is made of a substrate in the form of a film made of polyimide, polyester, glass epoxy or similar insulating substance. The film is formed with sprocket holes for conveyance and positioning and a device hole for receiving an IC chip. Cu (cuprum) or similar metal loft is adhered to the film by an adhesive and then etched to form leads of desired configuration and pads for electric selection. Metal bumps in the form of projections are provided on electrode terminals formed on an IC chip. The leads of the film and the bumps of the IC chip are bonded together by inner lead bonding GLB) using thermocompression or eutectic. The resulting film carrier tape is subjected to electric selection and BT (Burn-in Test). Finally, the leads are cut off at a desired length to complete a semiconductor device. As for a multipin configuration having a number of leads, the tape or insulating film is often intentionally left at the outboard ends of outer leads in order to prevent the outer leads from being disfigured. Then, the outer leads are bonded to bonding pads formed on, e.g., a printed circuit board or an ordinary lead frame.

The film carrier semiconductor device has an advantage that the bonding speed is high because bonding can be completed at a time without regard to the number of leads. Another advantage is that the assembly including bonding and the electric selection can be easily automated for thereby enhancing quantity production.

The prerequisite with the above bonding of the film carrier semiconductor device is that a gang bonding jig applied with heat and load for the simultaneous bonding be uniform in heat distribution and be flat on its surface contacting the inner leads in order to insure a uniform load. Further, the bumps on the IC chip must have a minimum of irregularity in height while the inner leads of the film carrier tape must have a minimum of irregularity in thickness.

On the other hand, the contour size of IC chips is increasing in parallel with the advance of integration and functions. In fact, IC chips having as many as 300 to 600 electrodes are in development.

Although the conventional ILB scheme bonds a number of bumps and inner leads at a time without regard to the number of connecting points, the load required for a single electrode or connecting point remains the same. Therefore, the load required of the gang bonding jig increases in proportion to the number of pins; for example, assuming that a load of 0.1 kg is necessary for a single connecting point, then the jig must exert a load of 60 kg for a 600-pin IC chip. Moreover, the heat distribution of the gang bonding jig must be uniform even when the IC chip is sized (10 mm 15 mm)×(10 mm to 15 mm); the temperature must lie in the range of from ±5° C. to ±7° C.

As stated above, to cope with the increasing size and the increasing number of pins of IC chips, the load for thermocompression must be increased, and the uniform temperature distribution and flatness of the gang bonding jig must be enhanced. These requirements highlight the following problems.

In the event of ILB, the load and heat concentrate only on several bumps to several ten bumps for a moment due to the short accuracy of bump configuration of an IC chip, particularly irregularity in thickness, and the short accuracy of the gang bonding jig and ILB device, particularly inclination or short flatness and parallelism. As a result, heavy stresses act on such particular bumps and cause nearby bumps to be short-circuited. In addition, the bumps peel off the interface between them and a silicon substrate or an insulating film, reducing the connection strength and destroying the chip itself. On the other hand, due to the short load and heat in the event of ILB, the bumps and inner leads peel off each other at their interface and lower the connection strength. This tendency becomes more prominent with an increase in the size of the IC chip and in the number of pins.

As stated above, the method which connects the bumps and leads at a time lowers the reliability of connection. It is therefore extremely difficult to increase the accuracy of the bump and lead configuration, particularly thickness, and the accuracy of parallelism, among others, of the gang bonding jig and ILB device due to the increasing size of an IC chip and the increasing number of pins.

In light of the above, there have been developed a method which connects a plurality of electrodes or bumps of an IC chip and a plurality of inner leads of a film carrier tape in a plurality of consecutive steps.

A single-point ILB method sequentially connects pairs of bumps and inner leads by use of a point bonding jig. An ILB device for practicing the single-point ILB method does not need complicated mechanical arrangements and is therefore miniature and low cost. Moreover, the point bonding jig needs only far smaller heat and far smaller load than the gang bonding jig because its contour is extremely small relative to the contour of an IC chip. For example, assume that an IC chip is sized 15 mm×15 mm, and that the tip of the point bonding chip is sized 0.1 mm×0.1 mm. Then, the heat distribution of the tip of the jig is less than ±1° C., and the load necessary for the jig is only several ten grams to several hundred grams. In addition, the parallelism between the jig and the bumps of the chip can be readily adjusted.

However, the problem with the single-point ILB is that the temperature during the ILB procedure increases due to the increasing size of the IC chip and the increasing number of pins. As a result, the film carrier tape is deformed to lower the dimensional accuracy of the chip. Specifically, the single-point ILB connects the electrodes of the chip and the inner leads of the film carrier in a plurality of consecutive steps. Therefore, as the single-point ILB proceeds, heat necessary for ILB (about 250° C. to 350° C.) is transferred to the film carrier via the inner leads, sequentially elevating the temperature of the substrate or film. The resulting thermal expansion of the substrate causes the film carrier and inner leads to deform. Consequently, the electrodes of the chip and the inner leads are dislocated relative to each other, resulting in defective bonding and short connection strength.

SUMMARY OF THE INVENTION

It is therefore an object of the present invention to provide a reliable method of producing a semiconductor device and capable of reducing the influence of localized load and heat due to the short accuracy of a gang bonding jig as well as the influence of the deformation of a film carrier tape ascribable to heat applied during single-point bonding.

In accordance with the present invention, a method of producing a semiconductor device has the steps of aligning inner leads formed on a film carrier tape with electrodes formed on an IC chip and laying the inner leads on the electrode, temporarily connecting the inner leads and electrodes by a low-temperature gang bonding jig, and sequentially bonding the temporarily bonded portions of the inner leads and electrodes by a point bonding jig.

Also, in accordance with the present invention, a method of producing a semiconductor device has the steps of aligning through holes formed in a film carrier tape with electrodes formed on an IC chip and then laying the through holes on the electrodes, temporarily connecting the electrodes and metal layers filling the through holes by a gang bonding jig, while heating a thermoplastic adhesive film fitted on the film carrier tape to cause the adhesive film to flow and adhere the film carrier tape and IC chip, sequentially bonding the temporarily bonded portions of the electrodes and metal layers by a point bonding jig.

BRIEF DESCRIPTION OF THE DRAWINGS

The above and other objects, features and advantages of the present invention will become more apparent from the following detailed description taken with the accompanying drawings in which.

In the figures, the same constituent parts are designated by like reference numerals.

DESCRIPTION OF THE PREFERRED EMBODIMENTS

Preferred embodiments of the method of producing a semiconductor device in accordance with the present invention will be described hereinafter.

1st Embodiment

Figure 1A:
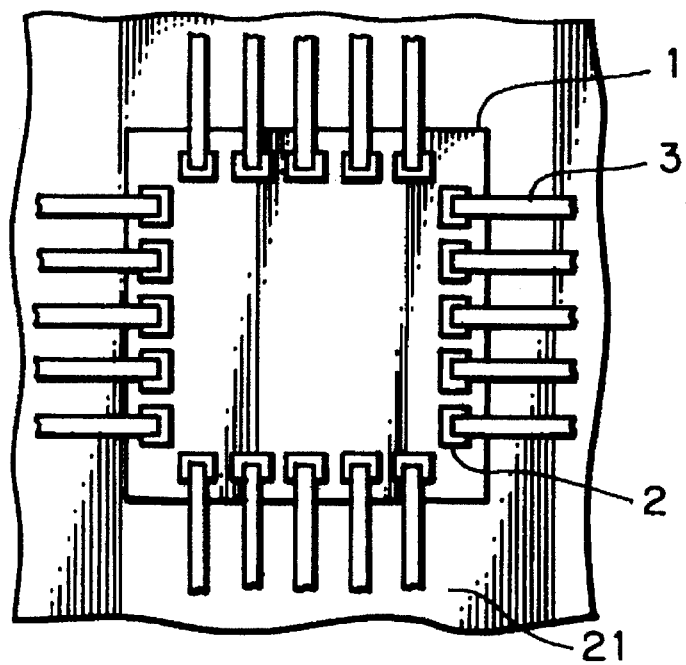
FIG. 1A and FIGS. 1B and 1C are respectively a plan view and sections showing a sequence of steps representative of a first embodiment of the present invention.
Figure 1B:
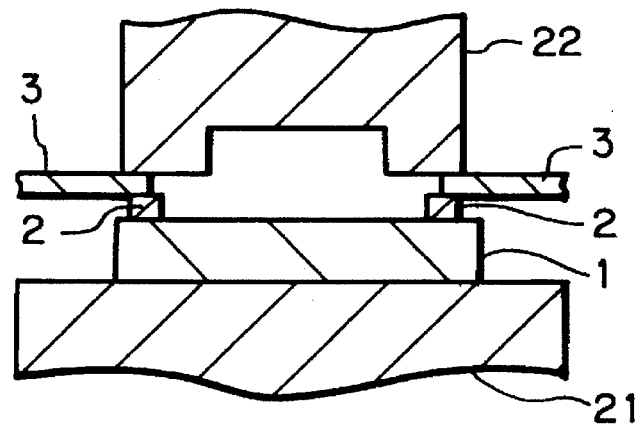
Figure 1C:
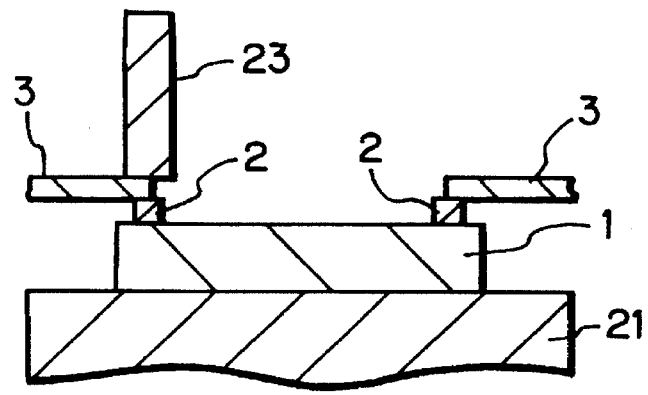

FIGS. 1A–1C show a sequence of steps representative of a first embodiment of the present invention. As shown in FIG. 1A, an IC chip 1 is positioned on a bonding stage 21 and provided with bump electrodes 2 on its top. A carrier tape has inner leads 3 each corresponding to one of the bump electrodes 2. In this condition, the inner leads 3 of the carrier tape are respectively laid on the bump electrodes 2 of the chip 1, as shown in FIG. 1A.

Subsequently, as shown in FIG. 1B, all the bump electrodes 2 and inner leads 3 are temporarily connected at the same time by a gang bonding jig 22 at a low temperature. Assume that the IC chip 1 is sized 15 mm×15 mm and formed with 700 bump electrodes 2 at a pitch of 80 μm. Then, the inner leads 3 are about 40 μm. wide each. As for ILB conditions, the temperature of the gang bonding jig 22 is between 380° C. and 420° C., the load of the jig 22 is between 30 kg and 40 kg, and the bonding time is between 0.5 second and 1.0 second. To maintain the chip 1 and jig 22 parallel to each other, their inclination must be less than 0.10 degree. High frequency vibration may be applied to the jig 22, if desired.

Thereafter, as shown in FIG. 1C, the combinations of the bump electrodes 2 and inner leads 3 are bonded one by one by single-point bonding. For this purpose, the stage 21 is caused to heat the electrodes 2 and leads 3 while ultrasonic vibration is applied to a point bonding jig 23. Specifically, the bonding stage 21 is heated to a temperature of 250° C. to 300° C., the jig 23 exerts a load of 40 g to 60 g, the ultrasonic vibration has a frequency of 60 kHz, and the bonding time is 0.05 second to 0.1 second. If desired, the point bonding jig 23 may be replaced with a plurality of point bonding jigs cooperating with each other.

As stated above, the temperate and the load required of the gang bonding jig 22 and particular to the embodiment are respectively only about 80% and about 50% to 80% of the conventional temperature of 480° C. to 520° C. and the conventional load of 55 kg to 65 kg. This protects the inner leads 3 from deformation ascribable to high temperatures and protects the film carrier tape from bending, waving and other deformation. Even if the parallelism between the jig 22 and the chip 1 is slightly low, defective connection does not occur because the temporary bonding is followed by the regular bonding using the point bonding jig 23.

2nd Embodiment

Figure 2:
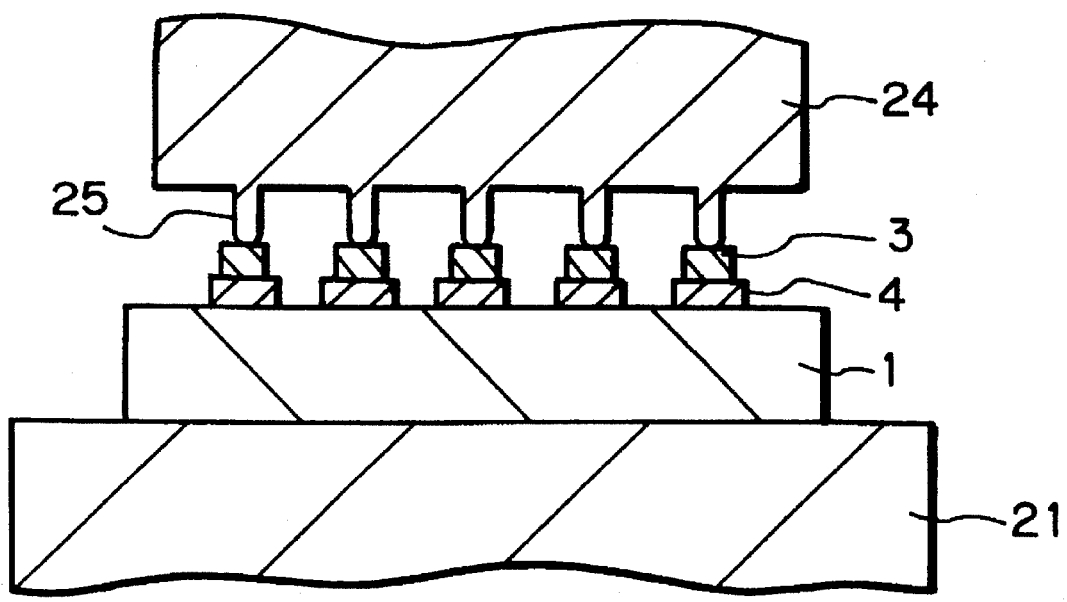
FIG. 2 is a section showing a second embodiment of the present invention.

FIG. 2 shows a second embodiment of the present invention. As shown, the IC chip 1 is positioned on the bonding stage 21 and formed with Al (aluminum) electrode pads 4 on its top. The inner leads 3 of the carrier tape are respectively laid on the electrode pads 4. A gang bonding jig 24 has projections 25 corresponding in position to the electrode pads 4. After the projections 25 have been respectively positioned on the inner leads 3, the inner leads 3 and electrode pads 4 are temporarily bonded together by heat and pressure.

Assume that the IC chip 1 is sized 15 mm×15 mm and formed with 700 electrode pads 4 at a pitch of 80 μm. Then, the inner leads 3 are about 40 μm. wide each. As for ILB conditions, the temperature of the gang bonding jig 24 is between 380° C. and 420° C., the load of the jig 24 is between 30 kg and 40 kg, and the bonding time is between 0.7 second and 1.0 second. The inclination of the jig 24 and chip 1 is maintained below 0.05 degree. High frequency vibration may be applied to the jig 22, if desired.

Subsequently, the pads 4 and inner leads 3 temporarily connected together are sequentially bonded by a point bonding jig having a sharp tip, as in the first embodiment. At this instant, the point bonding jig exerts a load of 40 g to 60 g, the ultrasonic vibration frequency is 50 kHz to 100 kHz, the temperature of the stage 21 is 250° C. to 350° C., and the bonding time is 0.08 second to 0.1 second.

3rd Embodiment

Figure 3A:
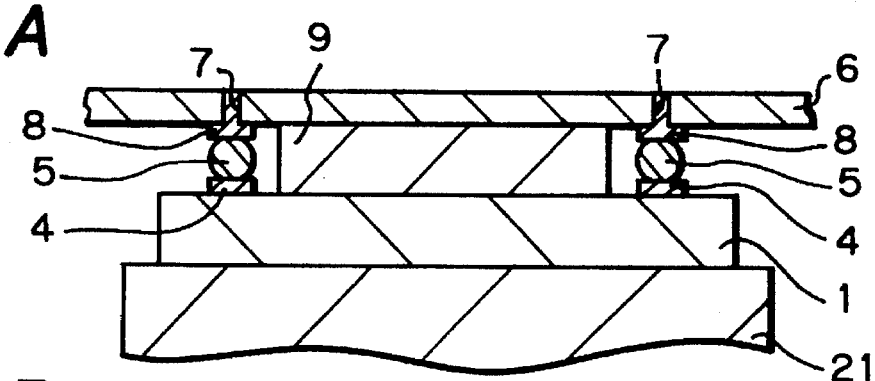
FIGS. 3A–3D are sections showing a third embodiment of the present invention.

A third embodiment of the present invention will be described with reference to FIGS. 3A–3D. As shown in FIG. 3A, the IC chip 1 has the electrode pads 4 and Au (gold) ball bumps 5 respectively formed on the electrode pads 4. The chip 1 is positioned on the bonding stage 21. A film carrier tape 6 is formed with through holes 7 at positions corresponding to the ball bumps 5. The through holes 7 are filled with metal layers. Lands 8 are provided on one end of the through holes 7. An adhesive film 9 is made of a thermoplastic resin and fitted on the intermediate portion of the surface of the tape 6 on which the lands 8 are positioned. The lands 8 are respectively laid on the ball bumps 5 while the adhesive film 9 is laid on the top of the chip 1.

Figure 3B:
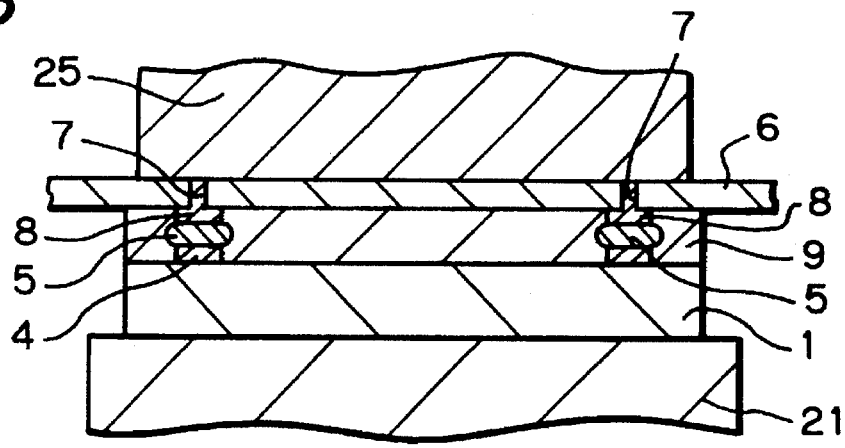

As shown in FIG. 3B, a heated gang bonding jig 25 is pressed against the film carrier tape 6 from above the tape 6 so as to temporarily connect the lands 8 of the tape 6 and the ball bumps 5 of the chip 1. Assume that the chip 1 is sized 10 mm×10 mm and formed with 240 electrode pads 4 in a single array at a pitch of 0.15 mm. Then, the electrode pads 4 are sized (0.1 mm to 0.11 mm)×(0.1 mm to 0.11 mm) each while the ball bumps 5 on the pads 4 are 0.03 mm to 0.05 mm high each and have a diameter of 0.08 mm to 0.09 mm each. For the temporary bonding, the gang bonding jig 25 exerts a load of 20 kg to 24 kg on the tape 6. In this condition, the jig 25 is heated to 250° C. to 330° C. for 0.5 second to 0.7 second and then cooled to 100° C. to 130° C. This kind of system is generally referred to as a pulse heat system.

Specifically, the load of the jig 25 bonds the lands 8 of the tape 6 to the ball bumps 5 by thermocompression. Subsequently, the adhesive film 9 is softened and caused to flow from the intermediate portion of the chip 1 as far as the edges of the chip 1, filling the gap between the chip 1 and the tape 6.

Figure 3C:
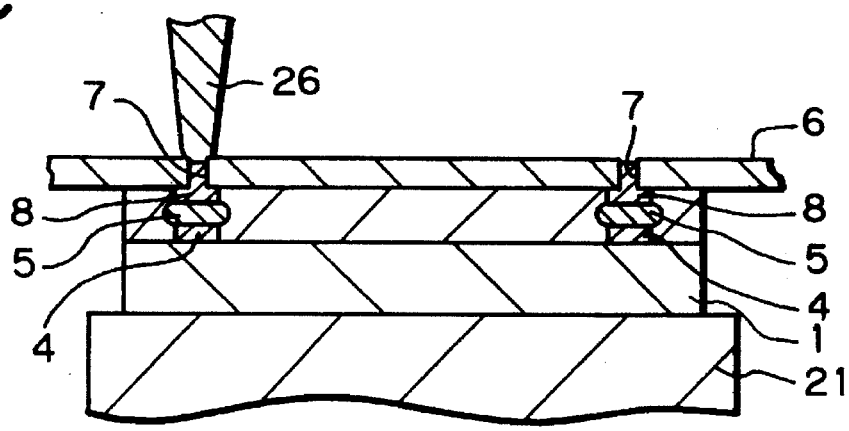

As shown in FIG. 3C, the lands 8 and ball bumps 5 temporarily connected together are sequentially bonded by heat applied from the stage 21 and ultrasonic vibration applied to a point bonding jig 26. For point bonding, the stage 21 is heated to 250° C. to 330° C., the jig 26 exerts a load of 40 g to 60 g, the ultrasonic vibration has a frequency of 50 kHz to 100 kH, and the bonding time is selected to be 0.05 second to 0.1 second.

Figure 3D:
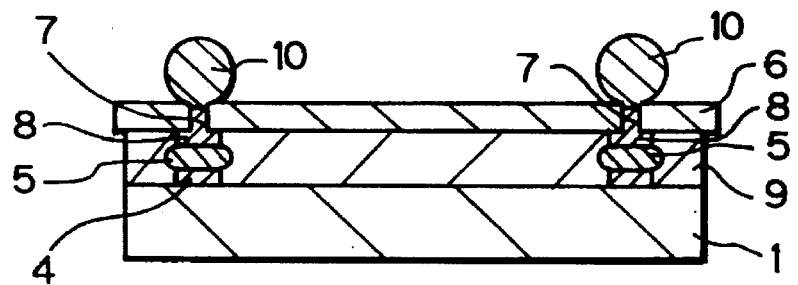

Finally, as shown in FIG. 3D, the tape 6 is cut off by use of a mold, laser or the like in the vicinity of the edges of the chip 1. Then, solder bumps 10 are formed by printing, injection, punching or similar technology on the surfaces of the metal layers filling the through holes 7. The resulting assembly constitutes a CSP (Chip Size Package) semiconductor device.

4th Embodiment

Figure 4A:
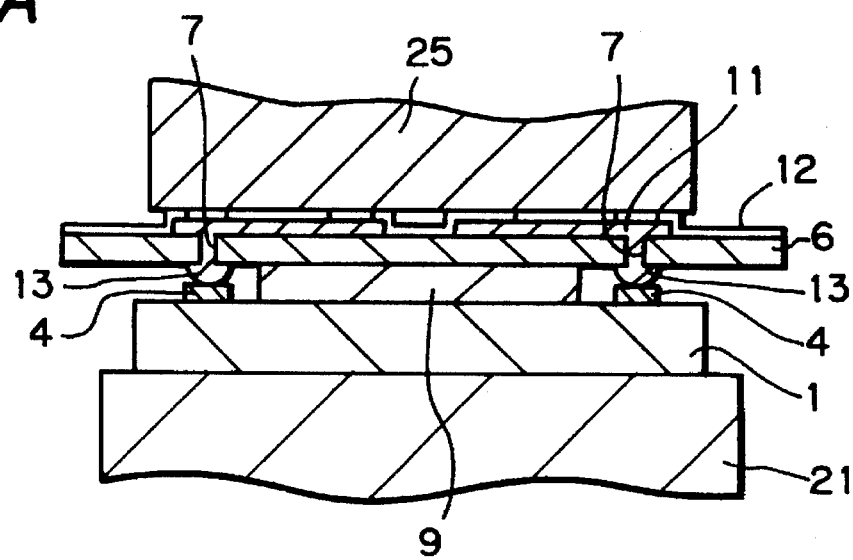
FIGS. 4A–4C are sections showing a fourth embodiment of the present invention.
Figure 4B:
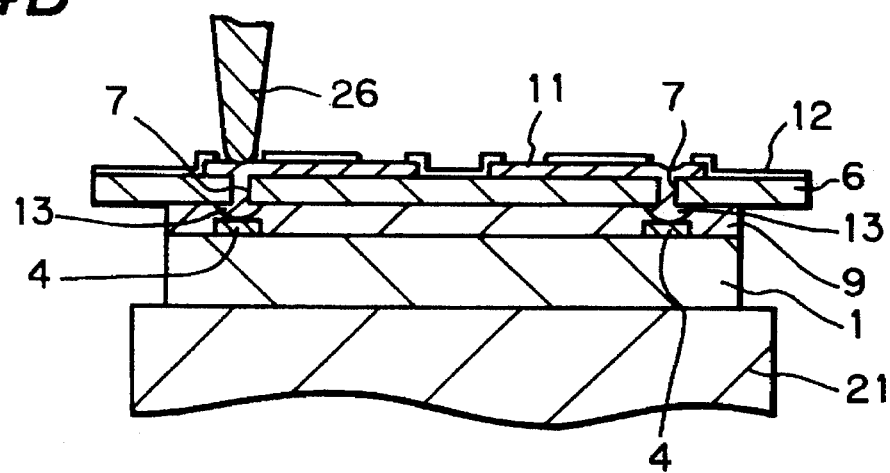
Figure 4C:
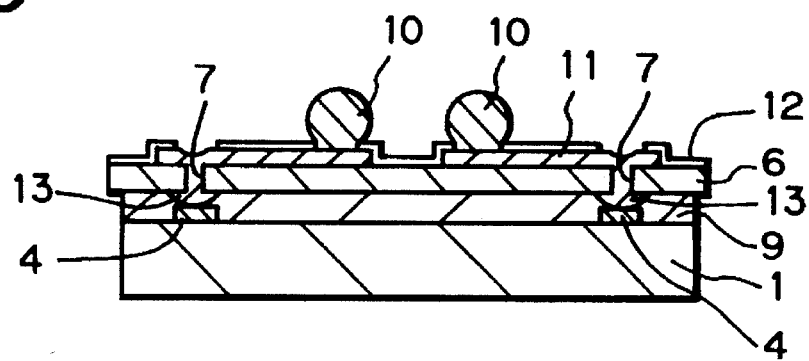

FIGS. 4A–4C show a fourth embodiment of the present invention. As shown in FIG. 4A, the through holes 7 are formed in the film carrier tape 6 and filled with metal layers, as in the third embodiment. A wiring pattern 11 is formed on one major surface of the tape 6 and covered with a protection film 12. Projections 13 are formed on the other major surface of the tape 6 and respectively connected to the metal layers filling the through holes 7. The projections 6 are respectively laid on the electrode pads 4 of the IC chip 1 located on the bonding stage 21. Then, the projections 6 and pads 4 are temporarily connected together by the gang bonding jig 25, as in the third embodiment.

Subsequently, as shown in FIG. 4B, the projections 13 are sequentially bonded to the associated pads 4 by the heat of the stage 21 and the ultrasonic vibration applied to the point bonding jig 26, as in the third embodiment.

As shown in FIG. 4C, the tape 6 having its projections 13 temporarily bonded to the pads 4 is cut off in the vicinity of the edges of the chip 1. Then, the solder bumps 10 are formed on the wiring pattern 11.

This embodiment is advantageous in that electrode pads can be arranged on the chip 1 at any desired positions (e.g. in a matrix) because of the wiring pattern 11. Hence, the embodiment can cope with an increase in the number of pins.

In summary, in accordance with the present invention, inner leads or lands provided on a film carrier tape and electrode pads provided on an IC chip are temporarily connected at the same time by low-temperature gang bonding and then bonded by point bonding. This obviates short-circuiting and defective connection ascribable to localized load and heat which are apt to occur during gang bonding due to the short flatness and inclination of a bonding jig. Further, defective connection ascribable to the dislocation of the inner leads which is apt to occur during point bonding due to the deformation of the film carrier tape is eliminated. Therefore, the present invention enhances reliable bonding even with a semiconductor device having as many as 600 to 1,000 pins.

Various modifications will become possible for those skilled in the art after receiving the teachings of the present disclosure without departing from the scope thereof.

What is claimed is:

1. A method of producing a semiconductor device, comprising the steps of:

(a) aligning inner leads formed on a film carrier tape with electrodes formed on an IC chip and laying said inner leads on said electrodes;

(b) temporarily connecting said inner leads and said electrodes by a low-temperature gang bonding jig; and (c) sequentially bonding temporarily bonded portions of said inner leads and said electrodes by a point bonding jig.

2. A method as claimed in claim 1, wherein said gang bonding jig has projections corresponding in position to said electrodes and said inner leads contacting each other.

3. A method as claimed in claim 1, further comprising (d) applying high-frequency vibration to at least one of said gang bonding jig and said point bonding jig.

4. A method as claimed in claim 1, wherein said gang bonding jig is heated to a temperature between 380° C. and 420° C.

5. A method of producing a semiconductor device, comprising the steps of:

(a) aligning through holes formed in a film carrier tape with electrodes formed on an IC chip and then laying said through holes on said electrodes;

(b) temporarily connecting said electrodes and metal layers filling said through holes by a gang bonding jig, while heating a thermoplastic adhesive film fitted on said film carrier tape to cause said adhesive film to flow and adhere said film carrier tape and said IC chip; and (c) sequentially bonding temporarily bonded portions of said electrodes and said metal layers by a point bonding jig.

6. A method as claimed in claim 5, further comprising (d) applying high-frequency vibration to said point bonding jig.

* * * * *